United States Patent
Won et al.

(10) Patent No.: US 11,655,336 B2
(45) Date of Patent: May 23, 2023

(54) POLYIMIDE FILM FOR PREPARING ROLL TYPE GRAPHITE SHEET

(71) Applicant: SKCKOLONPI INC, Chungcheongbuk-Do (KR)

(72) Inventors: Dong Young Won, Seoul (KR); Hyun Jai Lim, Gumi-Si (KP); Kyung Su Kim, Seoul (KR)

(73) Assignee: SKCKOLONPI INC, Chungcheongbuk-Do (KR)

( * ) Notice: Subject to any disclaimer, the term of this patent is extended or adjusted under 35 U.S.C. 154(b) by 397 days.

(21) Appl. No.: 16/758,224

(22) PCT Filed: Dec. 29, 2017

(86) PCT No.: PCT/KR2017/015754
§ 371 (c)(1),
(2) Date: Apr. 22, 2020

(87) PCT Pub. No.: WO2019/083093
PCT Pub. Date: May 2, 2019

(65) Prior Publication Data
US 2020/0291180 A1    Sep. 17, 2020

(30) Foreign Application Priority Data
Oct. 23, 2017   (KR) ......................... 10-2017-0137729

(51) Int. Cl.
| | | |
|---|---|---|
| *C08G 73/10* | (2006.01) | |
| *C08J 5/18* | (2006.01) | |
| *C08K 3/26* | (2006.01) | |
| *C08K 3/30* | (2006.01) | |
| *C08K 3/32* | (2006.01) | |

(52) U.S. Cl.
CPC ............ *C08G 73/1042* (2013.01); *C08J 5/18* (2013.01); *C08J 2379/08* (2013.01); *C08K 2003/265* (2013.01); *C08K 2003/3045* (2013.01); *C08K 2003/325* (2013.01); *C08K 2201/003* (2013.01)

(58) Field of Classification Search
CPC ......... C08J 2379/08; C08J 5/18; C08L 79/08; C08G 73/1071; C08G 73/01; C08G 73/1042
See application file for complete search history.

(56) References Cited

U.S. PATENT DOCUMENTS

| | | |
|---|---|---|
| 2007/0032589 A1 | 2/2007 | Nishikawa et al. |
| 2013/0164210 A1 | 6/2013 | Ohta et al. |
| 2015/0064484 A1 | 3/2015 | Chung et al. |
| 2015/0130098 A1 | 5/2015 | Hsiang et al. |
| 2017/0001867 A1 | 1/2017 | Kobayashi et al. |
| 2017/0073231 A1* | 3/2017 | Ohta ................. C04B 35/62218 |

FOREIGN PATENT DOCUMENTS

| | | |
|---|---|---|
| CN | 106744792 A | 5/2017 |
| CN | 106905527 A | 6/2017 |
| JP | WO2005023713 A1 | 11/2006 |
| JP | 2013209288 A | 10/2013 |
| JP | 2017043668 * | 3/2017 |
| JP | 2017160120 A | 9/2017 |
| JP | 2017179153 * | 10/2017 |
| JP | 2017179153 A | 10/2017 |
| WO | WO-2017073921 A1 | 5/2017 |

OTHER PUBLICATIONS

International Search Report and Written Opinion of the International Search Authority issued in PCT/KR2017/015754, dated Nov. 15, 2018; ISA/KR.

* cited by examiner

*Primary Examiner* — Gregory Listvoyb
(74) *Attorney, Agent, or Firm* — Harness, Dickey & Pierce, P.L.C.

(57) ABSTRACT

The present invention provides a polyimide film for a roll type graphite sheet prepared by imidizing a polyamic acid formed by a reaction of a dianhydride monomer and a diamine monomer, where the polyimide film has a modulus of 2.7 GPa or more.

16 Claims, 2 Drawing Sheets

[Fig. 1]
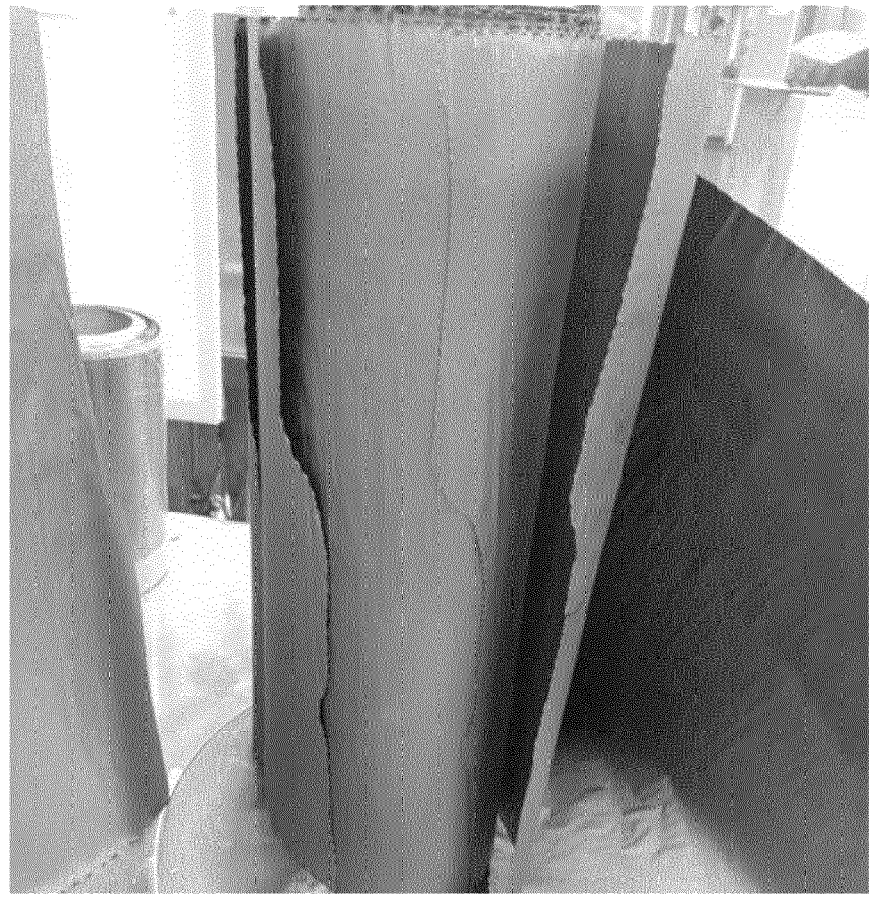
[Fig. 2]
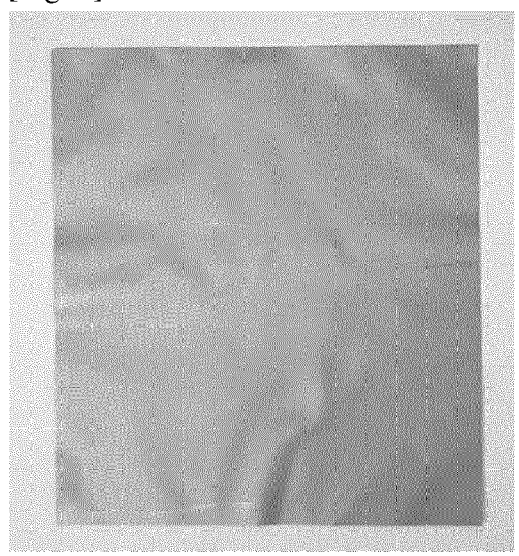

[Fig. 3]
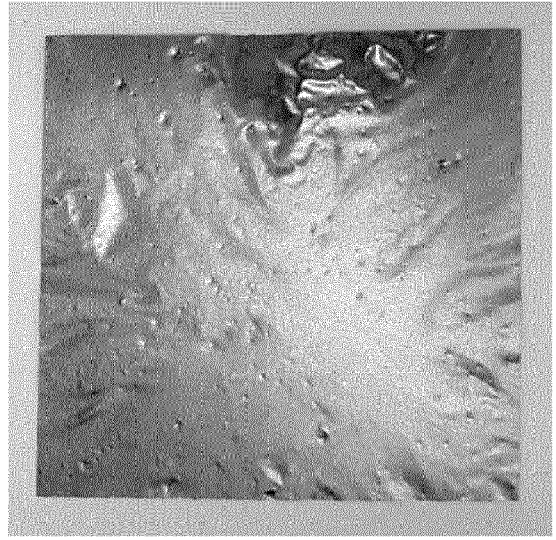
[Fig. 4]

POLYIMIDE FILM FOR PREPARING ROLL TYPE GRAPHITE SHEET

TECHNICAL FIELD

The present invention relates to a polyimide film for a roll type graphite sheet.

BACKGROUND ART

In general, a polyimide resin denotes a high heat-resistant resin, which is produced by solution-polymerizing an aromatic dianhydride(s), and an aromatic diamine(s) or diisocyanate(s) to obtain a polyamic acid derivative, and ring-closure dehydrating and imidizing the polyamic acid derivatives at high temperature to obtain the high heat-resistant resin.

A polyimide film denotes a film produced in a thin layer from the polyimide resin. Since the polyimide film has an excellent mechanical and thermal dimensional stability and a chemical stability, it is widely used in an electronic/electric material application, space/aviation application, and telecommunication application.

Particularly, a current trend for an electronic device tends to be light-weight, miniaturized, thin and highly-integrated. This trend results in an increase of heat generation per unit volume, followed by problems resulting from such heat loading. Therefore, an effective heat dissipation of such electronic device is important.

In this regard, graphite is exemplified as a means for heat-dissipation used in such electronic device. Graphite has a graphene-stacking structure, wherein the graphene is a 2-dimensional sheet consisting of a plate of carbon atoms arranged as hexagonal lattice, and, has high thermal conductivity and high mechanical strength.

Such graphite is widely used in an energy-storage material such as a second battery, fuel cell and supercapacitor, filter film, chemical detector, transparent electrode, and heat-dissipation material, and the like.

In particular, there is an increasing interest in the graphite sheet produced by carbonizing the polyimide films obtained from the polyimide resin and graphitizing them.

Specifically, the graphite sheet is produced by carbonizing and graphitizing long film-shaped polyimide films through heat treatment in different temperature ranges, respectively.

In addition, the carbonization and graphitization processes may be processed by heat-treating the polyimide film in a state of being cut at a predetermined length and unrolled, or in a state of a roll type wound at one time from one end to the other.

In this regard, heat applied during the carbonizing and graphitizing process causes shrinkage to the polyimide films. Accordingly, the dimension of the polyimide film may be partially changed.

In particular, when the polyimide film is subjected to the heat treatment in the wound roll state, due to stress generated and accumulated by the shrinkage from heat treatment, a part of the polyimide film may be frequently broken or damaged.

Heat-treatment of the polyimide film in a roll type can provide benefits, such as the simplification of a process and the saving of the time required for product production. However, even if merely a part of the polyimide film roll has the aforementioned problem, there is no choice but to discard the entire product. Furthermore, it is difficult to adopt a roll type process since a loss of manpower and time for managing the process, e.g., for replacement of raw materials may be necessarily increased.

As a result, when a roll type polyimide film having a high percentage of defects is employed, the productivity may be declined rather than improved. Particularly, this causes severe problems in a process of commercially mass-producing a graphite sheet prepared from such polyimide film.

Therefore, there is high technical need for fundamentally solving these problems.

DISCLOSURE OF INVENTION

Technical Problem

It is an object of the present invention to solve the above-mentioned problems of the prior art and also technical challenges to be solved in the art.

The present inventors have conducted intensive research and various experiments, and have found that it is possible to eliminate or minimize the deformation, rupture or damage that may occur in a process of producing a graphite sheet by carbonizing and graphitizing the polyimide film in a roll type state, by allowing a polyimide film to have a modulus of 2.7 GPa or more, as described below.

Accordingly, it is possible to reduce the percentage of defective products in the process of producing the graphite sheet, thereby saving manpower, time and cost required for the production of the graphite sheet. As a result, a decline in the productivity of the graphite sheet prepared from the polyimide film can be prevented.

Further, the present inventors found that the polyimide film can particularly contribute to effective commercial mass production of graphite sheets through employing the polyimide to produce the graphite sheet by carbonizing and graphitizing the polyimide film in a roll type. Thus, the present invention has been invented.

Solution to Problem

In one embodiment of the present invention, a polyimide film for a roll type graphite sheet is provided, wherein the polyimide film is produced by imidizing a polyamic acid formed by a reaction of a dianhydride monomer and a diamine monomer, and has a modulus of 2.7 GPa or more.

In this embodiment, said diamine monomer may include an oxydianiline (ODA) monomer and a para-phenylene diamine (PPD) monomer and have a molar ratio of ODA:PPD ranging from 70:30 to 82:18.

In another embodiment of the present invention, the diamine monomer may further include a methylenedianiline (MDA) monomer.

Further, said diamine monomer may have a molar ratio of (ODA+MDA):PPD ranging from 70:30 to 82:18.

Meanwhile, the polyimide film may include two or more fillers having different average particle diameters.

In this embodiment, said fillers may be sublimated in a process of carbonization and/or graphitization for producing the graphite sheet, to form voids in the graphite sheet.

In another embodiment of the present invention, the fillers may include a first filler having a relatively large average particle diameter and a second filler having a relatively small average particle diameter, and may have a content ratio of the first filler and the second filler ranging from 10:90 to 17:83.

In this embodiment, the first filler may have an average particle diameter of 2.0 μm to 2.5 μm, and the second filler may have an average particle diameter of 1.0 μm to 1.6 μm.

Further, the fillers may be contained in an amount of 3000 ppm to 5000 ppm based on the weight of the polyamic acid.

The fillers may be at least one selected from the group consisting of calcium carbonate, dicalcium phosphate and barium sulfate, particularly, dicalcium phosphate and/or barium sulfate.

In another embodiment of the present invention, the polyimide film carbonized and graphitized to produce a graphite sheet is provided.

In this embodiment, said carbonizing and the graphitizing processes may be carried out onto a sheet-type polyimide film wound in a roll type, which is rectangular in shape when it is unrolled.

Further, said graphitizing process may be performed at a heat treatment temperature of 2500° C. or higher.

Further, said graphite sheet may have a thickness of 13 μm to 40 μm.

In another embodiment of the present invention, an electronic device comprising said graphite sheet is provided.

Advantageous Effects of Invention

As described above, the polyimide film for a roll type graphite sheet according to the present invention has a modulus of 2.7 GPa or more. It is therefore possible to eliminate or minimize the deformation, rupture or breakage that may occur in a process of producing a graphite sheet by carbonizing and graphitizing the polyimide film in a roll type state.

Accordingly, it is possible to reduce the percentage of defective products in the process of producing the graphite sheet, thereby saving manpower, time and cost required for the production of the graphite sheet. As a result, it is possible to prevent a decline in the productivity of the graphite sheet prepared from the polyimide film.

In addition, the polyimide film can particularly contribute to effective commercial mass production of graphite sheets through employing the polyimide film to produce a graphite sheet by carbonizing and graphitizing the polyimide film in a roll type.

BRIEF DESCRIPTION OF DRAWINGS

FIG. 1 is a photograph showing a broken portion of a graphite sheet prepared from a polyimide film of Comparative Example A-4.

FIG. 2 is a photograph showing an external surface of a graphite sheet prepared from a polyimide film of Example A-1.

FIG. 3 is a photograph showing an external surface of a graphite sheet prepared from a polyimide film of Comparative Example B-3.

FIG. 4 is a photograph showing an external surface of the wound polyimide film of Comparative Example B-4.

MODE FOR THE INVENTION

Hereinafter, the present invention will be described in more detail. Throughout this application, the term "prepared" and "produced" can interchangeably be used.

The polyimide film for a roll type graphite sheet according to the present invention is produced by imidizing a polyamic acid formed by the reaction of a dianhydride monomer and a diamine monomer, and may have a modulus of 2.7 GPa or more.

As described above, when a typical polyimide film is carbonized and graphitized in a roll type state, a stress due to shrinkage may be accumulated, which may cause deformation, such as wrinkles, breakage or damage, or the like.

In this regard, said modulus indicates a value of a physical property related to tensile strength and elastic modulus of a specific material. The modulus is higher, the flexibility and elasticity become poor, while the mechanical rigidity improves.

Therefore, the polyimide film for a roll type graphite sheet according to the present invention has a modulus of 2.7 GPa or more, thereby showing an excellent mechanical rigidity. Accordingly, a polyimide film according to the present invention can eliminate or minimize the breakage or damage caused by the shrinkage and the accumulation of stress or the change of physical properties occurring during the carbonization and graphitization.

On the contrary, when the modulus of the polyimide film for a roll type graphite sheet is less than 2.7 GPa, due to the poor mechanical rigidity, it is impossible to securely prevent the breakage or damage caused by the shrinkage and the accumulation of stress or the change of physical properties occurring during the carbonization and graphitization of the polyimide film.

At this time, the modulus of the polyimide film for a roll type graphite sheet may be 5.0 GPa or less at the maximum, specifically, 4.2 GPa or less, and more specifically 3.8 GPa or less.

Meanwhile, the diamine monomer may include oxydianiline (ODA) and para-phenylene diamine (PPD) and may have a molar ratio represented by ODA:PPD=70:30 to 82:18.

If the PPD is contained in an excessively small amount outside the above range, the polyimide film cannot have a modulus of 2.7 GPa or more. Thus, the desired effects may not be achieved.

On the contrary, when the PPD is contained in an excessively large molar ratio outside the above range, graphite powder may be generated on the surface of the final graphite sheet prepared from the polyimide film. Thus, the inside of an electronic device supplied with the graphite sheet may be contaminated. This may cause a short circuit during the operation of the electronic device.

The diamine monomer may further include a methylenedianiline (MDA) monomer.

However, even in such a case, the diamine monomer has a molar ratio of (ODA+MDA):PPD=70:30 to 82:18. Since the PPD is included in the same range as described above, it is possible to maintain the physical properties of the polyimide film, specifically the modulus, within a desired range and to eliminate or minimize the generation of graphite powder during the production of the graphite sheet.

Meanwhile, the polyimide film for a roll type graphite sheet according to the present invention may include two or more fillers having different average particle diameters.

As stated above, a degradation of flexibility and an increase of brittleness of the graphite sheet may typically happen during the carbonizing and/or graphitizing steps involving the heat-treatment. In this regard, the fillers contained in the polyimide film according to the present invention may be sublimated during the carbonizing and/or graphitizing steps during the production of the graphite sheet, forming voids in the graphite sheet.

Further, the fillers are sublimated by heat during the carbonizing and/or graphitizing steps of the production of the graphite sheet, resulting in the gases, and the gases form explosive voids in the graphite sheet. The explosive voids formed in the graphite sheet may improve the flexibility of the graphite sheet and, as a result, improve the handling and the molding property of the graphite sheet.

Specifically, the use of 2 or more fillers having different average particle diameters in the polyimide films for the roll-type graphite sheet can simultaneously provide more excellent thermal conductivity, flexibility, and brittleness in the desired ranges during the production of the graphite sheet compared to the use of fillers having the uniform average particle diameter, and prevent occurrence of the protruding trails resulting from the low roughness of the surface of the polyimide film.

In particular, if the polyimide film has fillers having only small average particle diameter, due to the tiny explosive voids, the thermal conductivity of the graphite sheets is maintained and the flexibility of the sheet can be improved; whereas, due to the small average particle diameter of the fillers, the surface roughness of the polyimide films comprising the same can be declined before making the graphite sheets.

Accordingly, when the polyimide film is wound up during the production of the graphite sheet, the friction forces between the surfaces of the overlapping films may be increased, so that the handling property thereof may be decreased. Specifically, the increase of the friction force between the overlapping films makes it difficult to rectify the winding defects due to "obliquely tilting" occurring during the winding step of the polyimide film. Resultantly, the winding property may be declined, and the adhesion increases during the corona treatment may cause the blocking phenomenon.

Further, if tiny foreign substances are entered between the overlapping films during the winding step, it is difficult to secure enough space to offset the size of the foreign substances. Resultantly, the repetitions of the winding step may cause thickness increase of the roll, which is responsible for the increase of the thickness deviation of the parts bearing the foreign substances. In the end, the protruding trails which are the deformations causing from the foreign substance can be formed.

On the contrary, if the polyimide film contains fillers having only the large average particle diameter, the explosive voids resulting from the sublimation of the fillers during the carbonizing and graphitizing steps, form the excessively larger protrusions, more specifically bright spots which are the protrusions having a diameter of at least about 0.5 mm on the surface of the graphite sheet, causing the external surface defects. Further, since the larger voids are responsible for the longer heat transfer path of the graphite sheet, the thermal conductivity of the graphite sheet may be reduced. As the amount of voids formed in the graphite sheet is reduced, the brittleness of the graphite sheet may be increased.

Consequently, by using fillers simultaneously comprising a first filler having a relatively large average particle diameter and a second filler having a relatively small average particle diameter, the graphite sheet produced therefrom may maintain the desired thermal conductivity and simultaneously may solve the problems resulting from the use of the filler having only the uniform average particle diameter.

In this regard, the first filler and the second filler may have a content ratio of 10:90 to 17:83.

Further, the first filler has an average particle diameter of 2.0 μm to 2.5 μm, and the second filler has an average particle diameter of 1.0 μm to 1.6 μm.

If the compositional ratio of the first and the second fillers and/or the average particle diameters thereof are out of the range and are excessively larger or smaller, the thermal conductivity, the flexibility and the brittleness of the graphite sheet finally produced cannot be simultaneously maintained in the desired range, and said fillers and the voids occurring during the sublimation of the fillers are responsible for the decline of the winding property of film, the increase of the surface protruding trails, and the external surface defects of the graphite sheet, as explained above.

Meanwhile, the fillers are contained in the range of 3000 ppm to 5000 ppm based on the weight of the polyamic acid.

If the filler is contained in the range of less than 3000 ppm based on the weight of the polyamic acid, the occurrence of the voids in the graphite sheet resulting from the sublimation of the fillers decline. Resultantly, the desired flexibility increase effects may not be achieved; the surface roughness reduction of the polyimide film causes the increase of the friction force and the decline of the winding property; and the foreign substances entered during the winding step are responsible for the protruding trails.

On the contrary, if the content of the filler is more than 4000 ppm based on the total of fillers, the occurrence of the voids in the graphite sheet due to the sublimation of the fillers excessively increases, causing the degradation of the thermal conductivity of the graphite sheet. Further, the external surface defects may be increased by the bright spots occurring on the surface of the graphite sheet due to the sublimation of the fillers.

The two or more fillers having different average particle diameters may be made of the same or different materials, and specifically, the fillers may be at least one selected from the group consisting of calcium carbonate, dicalcium phosphate and barium sulfate.

More specifically, the two or more fillers having different average particle diameters may be dicalcium phosphate and/or barium sulfate, but they are not limited thereto. If the fillers are sublimated during the production of the graphite sheet involving the carbonizing and graphitizing steps of the polyimide film and may form sufficient voids, they are not significantly limited.

In another embodiment of the present invention, the present invention provides a graphite sheet produced by carbonizing and graphitizing the polyimide film.

In this embodiment, the carbonization and graphitization may be carried out onto a sheet-type polyimide film wound in a roll type, which is rectangular in shape when it is unrolled. In this case, the polyimide film according to the present invention may exhibit particularly remarkable effects.

The heat treatment temperature in the graphitization process may be 2500° C. or higher. If the heat treatment temperature in the graphitization process is lower than 2500° C., the physical properties of the graphite sheet produced through the above process may be deteriorated.

In addition, the graphite sheet may have a thickness of 13 to 40 μm. If the thickness of the graphite sheet is too thin or too thick from the desired range, the thermal conductivity of the desired range cannot be achieved.

In another embodiment of the present invention, the present invention provides an electronic device including the graphite sheet. In this regard, since specific types, constructions, or structures of electronic devices are known in the conventional arts, the detailed descriptions thereon will be omitted.

Although the invention will be further described through the following examples and comparative examples below, the following examples are not to be construed to limit the present invention.

Preparation Example: Preparation of Polyamic Acid Solution

Preparation Example 1

A 0.8 L reactor was charged with 374.8 g of dimethylformamide as a solvent and the temperature was set to 20° C. Then, 33.2 g of ODA and 7.7 g of PPD as diamine monomers were added and dissolved. Then, 51.2 g of pyromellitic dianhydride as dianhydride was added, dissolved and polymerized to prepare a polyamic acid solution having a molar ratio of ODA:PPD=70:30.

Preparation Example 2

A 0.8 L reactor was charged with 380.2 g of dimethylformamide as a solvent and the temperature was set to 20° C. Then, 35.1 g of ODA and 6.3 g of PPD as diamine monomers were added and dissolved. Then, 50.6 g of pyromellitic dianhydride as dianhydride was added, dissolved and polymerized to prepare a polyamic acid solution having a molar ratio of ODA:PPD=75:25.

Preparation Example 3

A 0.8 L reactor was charged with 387.5 g of dimethylformamide as a solvent and the temperature was set to 20° C. Then, 37.8 g of ODA and 4.5 g of PPD as diamine monomers were added and dissolved. Then, 49.8 g of pyromellitic dianhydride as dianhydride was added, dissolved and polymerized to prepare a polyamic acid solution having a molar ratio of ODA:PPD=82:18.

Preparation Example 4

A 0.8 L reactor was charged with 369.2 g of dimethylformamide as a solvent and the temperature was set to 20° C. Then, 31.2 g of ODA and 9.1 g of PPD as diamine monomers were added and dissolved. Then, 51.9 g of pyromellitic dianhydride as dianhydride was added, dissolved and polymerized to prepare a polyamic acid solution having a molar ratio of ODA:PPD=65:35.

Preparation Example 5

A 0.8 L reactor was charged with 390.6 g of dimethylformamide as a solvent and the temperature was set to 20° C. Then, 38.9 g of ODA and 3.7 g of PPD as diamine monomers were added and dissolved. Then, 49.5 g of pyromellitic dianhydride as dianhydride was added, dissolved and polymerized to prepare a polyamic acid solution having a molar ratio of ODA:PPD=85:15.

Preparation Example 6

A 0.8 L reactor was charged with 374.8 g of dimethylformamide as a solvent and the temperature was set to 20° C. Then, 28.4 g of ODA, 33.2 g of MDA and 7.7 g of PPD as diamine monomers were added and dissolved. Then, 51.2 g of pyromellitic dianhydride as dianhydride was added, dissolved and polymerized to prepare a polyamic acid solution having a molar ratio of (ODA+MDA):PPD=70:30.

Preparation Example 7

A 0.8 L reactor was charged with 380.2 g of dimethylformamide as a solvent and the temperature was set to 20° C. Then, 30.4 g of ODA, 4.7 g of MDA and 6.3 g of PPD as diamine monomers were added and dissolved. Then, 50.6 g of pyromellitic dianhydride as dianhydride was added, dissolved and polymerized to prepare a polyamic acid solution having a molar ratio of (ODA+MDA):PPD=75:25.

Preparation Example 8

A 0.8 L reactor was charged with 387.5 g of dimethylformamide as a solvent and the temperature was set to 20° C. Then, 33.2 g of ODA, 4.6 g of MDA and 4.5 g of PPD as diamine monomers were added and dissolved. Then, 49.8 g of pyromellitic dianhydride as dianhydride was added, dissolved and polymerized to prepare a polyamic acid solution having a molar ratio of (ODA+MDA):PPD=82:18.

Preparation Example 9

A 0.8 L reactor was charged with 369.2 g of dimethylformamide as a solvent and the temperature was set to 20° C. Then, 26.4 g of ODA, 4.8 g of MDA and 9.1 g of PPD as diamine monomers were added and dissolved. Then, 51.9 g of pyromellitic dianhydride as dianhydride was added, dissolved and polymerized to prepare a polyamic acid solution having a molar ratio of (ODA+MDA):PPD=65:35.

Preparation Example 10

A 0.8 L reactor was charged with 390.6 g of dimethylformamide as a solvent and the temperature was set to 20° C. Then, 34.3 g of ODA, 4.6 g of MDA and 3.7 g of PPD as diamine monomers were added and dissolved. Then, 49.5 g of pyromellitic dianhydride as dianhydride was added, dissolved and polymerized to prepare a polyamic acid solution having a molar ratio of (ODA+MDA):PPD=85:15.

Example A and Comparative Example A: Preparation of Polyimide Films Having Different Composition of Diamine Monomer Example A-1

0.028 g of dicalcium phosphate having an average particle diameter of 2.0 μm as a first filler and 0.249 g of dicalcium phosphate having an average particle diameter of 1.0 μm as a second filler were added to the polyamic acid solution prepared in Preparation Example 1, to prepare a mixed solution wherein a content ratio of the first filler and the second filler is 10:90 and the total content of the fillers is 3000 ppm based on the weight of the polyamic acid. The mixed solution was coated on a glass plate or a steel plate so that the mixed solution has a predetermined thickness after drying. The mixed solution was dried in an oven of 110° C. for 4 minutes with a hot air, in an oven of 280° C. for 3 minutes with a hot air and in an oven of 420° C. for 3 minutes with a hot air, successively, to produce a long sheet-like polyimide film having an area of 150 mm×120 mm.

<Example A-2> to <Example A-6>

Polyimide films were produced in the same manner as in Example A-1, with the exception that the polyamic acid solutions prepared in Preparation Examples 2, 3 and 6 to 8 were used.

<Comparative Example A-1> to <Comparative Example A-4>

Polyimide films were produced in the same manner as in Example A-1, with the exception that the polyamic acid solutions prepared in Preparation Examples 4, 5, 9 and 10 were used.

Experimental Example A: Measurement of Modulus of Polyimide Film

The modulus of the polyimide films produced in Examples A-1 to A-6 and Comparative Examples A-1 to A-4 was measured by the ASTM D 882 method using the Instron 5564 model. The results are shown in Table 1 below.

TABLE 1

|  | Modulus (GPa) |
| --- | --- |
| Example A-1 | 3.5 |
| Example A-2 | 3.2 |
| Example A-3 | 2.7 |
| Example A-4 | 3.3 |
| Example A-5 | 3.1 |
| Example A-6 | 2.7 |
| Comparative Example A-1 | 4.2 |
| Comparative Example A-2 | 2.5 |
| Comparative Example A-3 | 4.1 |
| Comparative Example A-4 | 2.4 |

As shown in Table 1, the polyimide films of Examples A-1 to A-6 having the compositions of diamine monomers according to the present invention have an excellent modulus of 2.7 GPa or more, while the polyimide films of Comparative Examples A-2 and A-4 falling outside the composition range of the diamine monomers and containing PPD in an excessively small molar ratio have a relatively low modulus of less than 2.7 GPa.

Experimental Example B: Observation of Breakage of Graphite Sheet and Generation of Graphite Powder The polyimide films prepared in Examples A-1 to A-6 and Comparative Examples A-1 to A-4 were scaled up to have a length of 100 m. The respective polyimide film was continuously wound from one end to the other end to provide 10 roll-type polyimide films. The respective polyimide film roll was heated to 1,200° C. at a rate of 3° C./min under the presence of a nitrogen gas using a high temperature furnace capable of performing carbonization and maintained for about 2 hours (carbonization). Subsequently, the temperature was raised to 2,800° C. at a heating rate of 5° C./min under the presence of an argon gas using an ultra-high temperature furnace and was maintained for 1 hour. Thereafter, the polyimide film rolls were cooled to produce roll type graphite sheets.

The roll-type graphite sheets thus produced were unwound to observe breakage of the graphite sheets and/or generation of graphite powder. In each case, the number of graphite sheets having breakage occurred among the 10 graphite sheets is shown in Table 2 below.

TABLE 2

|  | Number of Rolls having breakages (EA) | Generation of graphite powder |
| --- | --- | --- |
| Example A-1 | 0 | x |
| Example A-2 | 0 | x |
| Example A-3 | 1 | x |
| Example A-4 | 0 | x |
| Example A-5 | 0 | x |
| Example A-6 | 2 | x |
| Comparative Example A-1 | 0 | ○ |
| Comparative Example A-2 | 5 | x |
| Comparative Example A-3 | 0 | ○ |
| Comparative Example A-4 | 7 | x |

As shown in Table 2, the graphite sheets prepared from the polyimide films of Examples A-1 to A-6 having the compositions of diamine monomers according to the present invention have no or few breakages, while the graphite sheets produced from the polyimide films of Comparative Examples A-2 and A-4 falling outside the composition range of the diamine monomers and containing PPD in an excessively small molar ratio have a relatively large number of breakages, i.e., 5 and 7 rolls.

This is because the polyimide films of Examples A-1 to A-6 exhibit excellent modulus and mechanical rigidity through the specific composition of diamine monomers. Specifically, when the graphite sheet is produced by winding the polyimide film in a roll type, despite the shrinkage of the film generated in the carbonization and graphitization process, the stress and the change of physical properties accumulated accordingly, it is possible to securely prevent generation of ruptures or breakages in the final graphite sheet with the excellent modulus and mechanical rigidity.

Particularly, in the polyimide films of Comparative Examples A-1 and A-3 falling outside the composition range of the diamine monomers and containing PPD in an excessively large molar ratio, although there was no breakage due to the increased modulus, which was generated during the production of the graphite sheets, graphite powder was generated on the surfaces of the graphite sheets.

FIG. 1 is a photograph showing the broken portion of the graphite sheet prepared from the polyimide film of Comparative Example A-4.

In view of FIG. 1, the polyimide film of Comparative Example A-4 containing PPD at a lower molar ratio than the desired range has a relatively low modulus of less than 2.7 GPa. In the graphite sheet prepared from said polyimide film, breakages were generated in the process of carbonization and graphitization performed in a roll form.

Example B and Comparative Example B: Production of Polyimide Films Having Different Content Ratio, Particle Diameters and Total Content of Fillers Example B-1

A polyimide film was prepared in the same manner as in Example A-1, with the exception that the first and second fillers were added so as to have a content ratio of 13:87.

Example B-2

A polyimide film was prepared in the same manner as in Example A-1, with the exception that the first and second fillers were added so as to have a content ratio of 17:83.

Example B-3

A polyimide film was prepared in the same manner as in Example A-1, with the exception that the first filler has an average particle diameter of 2.3 μm.

Example B-4

A polyimide film was prepared in the same manner as in Example A-1, with the exception that the first filler has an average particle diameter of 2.5 μm.

Example B-5

A polyimide film was prepared in the same manner as in Example A-1, with the exception that the second filler has an average particle diameter of 1.3 μm.

Example B-6

A polyimide film was prepared in the same manner as in Example A-1, with the exception that the second filler has an average particle diameter of 1.6 μm.

Example B-7

A polyimide film was prepared in the same manner as in Example A-1, with the exception that the total content of the fillers is 4000 ppm based on the weight of the polyamic acid.

Example B-8

A polyimide film was prepared in the same manner as in Example A-1, with the exception that the total content of the fillers is 5000 ppm based on the weight of the polyamic acid.

Comparative Example B-1

A polyimide film was prepared in the same manner as in Example A-1, with the exception that the first and second fillers were added so as to have a content ratio of 5:95.

Comparative Example B-2

A polyimide film was prepared in the same manner as in Example A-1, with the exception that the first and second fillers were added so as to have a content ratio of 20:80.

Comparative Example B-3

A polyimide film was prepared in the same manner as in Example A-1, with the exception that only the first filler was added as the filler.

Comparative Example B-4

A polyimide film was prepared in the same manner as in Example A-1, with the exception that only the second filler was added as filler.

Comparative Example B-5

A polyimide film was prepared in the same manner as in Example A-1, with the exception that the filler having an average particle diameter of 1.8 μm was added instead of the first filler.

Comparative Example B-6

A polyimide film was prepared in the same manner as in Example A-1, with the exception that the filler having an average particle diameter of 3.0 μm was added instead of the first filler.

Comparative Example B-7

A polyimide film was prepared in the same manner as in Example A-1, with the exception that the filler having an average particle diameter of 0.5 μm was added instead of the second filler.

Comparative Example B-8

A polyimide film was prepared in the same manner as in Example A-1, with the exception that the filler having an average particle diameter of 1.8 μm was added instead of the second filler.

Comparative Example B-9

A polyimide film was prepared in the same manner as in Example A-1, with the exception that the total content of the fillers is 2000 ppm based on the weight of the polyamic acid.

Comparative Example B-10

A polyimide film was prepared in the same manner as in Example A-1, with the exception that the total content of the fillers is 6000 ppm based on the weight of the polyamic acid.

Experimental Example C: Measurement of Heat Conductivity, Brittleness and Protruding Trails Generation of Graphite Sheet Graphite sheets were prepared according to the method of Experimental Example B using the polyimide films produced in Examples A-1, B-1 to B-8 and Comparative Examples B-1 to B-8, respectively.

The heat conductivity, the brittleness, and the number of protruding trails generated by the introduction of foreign substances during winding were measured. The results are shown in Table 3 below.

For reference, the heat conductivity was measured according to the ASTM E 1461 method which is a heat conductivity measurement standard for heat radiation materials. The brittleness was measured by producing 10 graphite sheets for each of the Examples and Comparative Examples and evaluating the bending resistance of the 10 graphite sheets.

The bending resistance evaluation was performed by repeatedly folding and unfolding the graphite sheets prepared from the polyimide films of the Examples and Comparative Examples and measuring the number of repetitions until the graphite sheet is cut. The bending resistance was evaluated using MIT-DA (Folding Endurance Tester) manufactured by TOYO SEIKI KOGYO CO., LTD. The measurement was carried out by cutting the graphite sheets to have a width of 15 mm. The measurement was conducted under the condition that the radius of curvature of a clamp for fixing and folding the graphite sheets is 0.5 mm, the bending angle is 135 degrees, the bending speed is 90 times/min, and the load is 250 g.

For reference, the higher the brittleness of the graphite sheet, the smaller the number of repetitions until the graphite sheet is cut. Conversely, the lower the brittleness is, the greater the number of repetitions is.

In addition, the number of protruding trails was measured by winding 100 m of polyimide film in the form of a roll before producing each of the graphite sheets and then measuring the number of protruding trails generated on the outermost surface of the roll.

TABLE 3

|  | Heat conductivity (W/m · K) | Number of repetitions in the bending resistance evaluation (times) | Number of protruding trails generated (EA) |
|---|---|---|---|
| Example A-1 | 1428 | 26 | 0 |
| Example B-1 | 1424 | 24 | 0 |
| Example B-2 | 1415 | 23 | 0 |
| Example B-3 | 1408 | 21 | 0 |
| Example B-4 | 1397 | 19 | 0 |
| Example B-5 | 1402 | 21 | 0 |
| Example B-6 | 1386 | 18 | 0 |
| Example B-7 | 1387 | 20 | 0 |
| Example B-8 | 1366 | 15 | 0 |
| Comparative Example B-1 | 1430 | 26 | 5 |
| Comparative Example B-2 | 1320 | 10 | 0 |
| Comparative Example B-3 | 1261 | 4 | 0 |
| Comparative Example B-4 | 1434 | 24 | 7 |
| Comparative Example B-5 | 1438 | 26 | 8 |
| Comparative Example B-6 | 1319 | 12 | 0 |
| Comparative Example B-7 | 1385 | 17 | 13 |
| Comparative Example B-8 | 1273 | 5 | 0 |
| Comparative Example B-9 | 1424 | 24 | 16 |
| Comparative Example B-10 | 1315 | 9 | 0 |

As shown in Table 3, the graphite sheets prepared from the polyimide films of Examples A-1 and B-1 to B-8 having the content ratio, the particle diameter and the total content of the fillers according to the present invention can maintain excellent heat conductivity, excellent flexibility and low brittleness as compared with Comparative Examples B-1 to B-10 which fall outside the above range of at least one of the content ratio, the particle diameter and the total content of the fillers; and that the addition of the fillers having different average particle diameters in the desired range, can prevent the occurrence of the protruding trails on the film surface resulting from the entrance of the foreign substances during winding the polyimide films and no bright spot resulting from the sublimation of the fillers was found in the graphite sheet according to present invention.

On the contrary, Comparative Example B-1 (containing a large amount of the second filler having a relatively small average particle diameter), Comparative Example B-4 (containing only the second filler), Comparative Example B-5 (containing the filler having a smaller average particle diameter than the first filler), Comparative Example B-7 (containing the filler having a smaller average particle diameter than the second filler), and Comparative Example B-9 (having an excessively low total content of the fillers falling outside the desired range), exhibited excellent heat conductivity and low brittleness compared to those of other comparative examples, but, it is shown that because of the low roughness of the polyimide films, the decline of the winding property happened during the treatment procedures and the protruding trails resulting from the entrance of the foreign substances during the winding of the film were formed on the surface thereof.

In addition, Comparative Example B-2 (containing a larger amount of the first filler having a relatively large average particle diameter), Comparative Example B-3 (containing only the first filler), Comparative Example B-6 (containing the filler having a larger average particle diameter than the first filler), Comparative Example B8 (containing the filler having a larger average particle diameter than the second filler), and Comparative Example B-10 (having an excessively high total content of the fillers falling outside the desired range), prevented the generation of the protruding trails resulting from the introduction of the foreign substances during the winding of the film containing the fillers compared to those of other comparative examples. However, the thermal conductivities declined and brittleness increased due to the variation of the amounts and the distributions of the voids in the graphite sheet.

FIGS. 2 and 3 show photographs of an external surface of graphite sheets prepared from polyimide films of Example A-1 and Comparative Example B-3.

FIGS. 2 and 3 show that the external surface of the graphite sheet produced from the polyimide film of example 1, which fulfills the requirements of the particle diameter, content ratio and total content, is smooth.

On the contrary, in the graphite sheet produced from the polyimide film of Comparative Example B-3 containing only the first filler having a relatively large average particle diameter as filler, the bright spots resulting from the large voids were formed, which is responsible for the occurrence of the external surface defects.

FIG. 4 shows a photograph of the external surface of a wound polyimide film of Comparative Example B-4.

FIG. 4 shows that when the polyimide film of Comparative Example B-4 containing only the second filler having a small average particle diameter is wound to produce a graphite sheet, foreign substances are introduced between the film surfaces overlapping with each other. Thus, the generation of protruding trails shown in the red circle appears as a refraction of an image reflected from on the surface.

While the present invention was shown and described with reference to exemplary embodiments and drawings thereof, it will be understood by those skilled in the art that various changes and modifications may be made therein without departing from the scope of the invention as defined by the appended claims.

The invention claimed is:

1. A polyimide film for a roll type graphite sheet produced by imidizing a polyamic acid formed by a reaction of a dianhydride monomer and a diamine monomer,
   wherein the polyimide film has a modulus of 2.7 GPa or more,
   wherein the polyimide film comprises a first filler having an average particle diameter of about 2.0 μm to 2.5 μm and a second filler having an average particle diameter of about 1.0 μm to 1.6 μm.

2. The polyimide film according to claim 1, wherein the diamine monomer comprises an oxydianiline (ODA) monomer and a para-phenylene diamine (PPD) monomer and has a molar ratio of ODA:PPD ranging from 70:30 to 82:18.

3. The polyimide film according to claim 1, wherein the diamine monomer further comprises a methylenedianiline (MDA) monomer.

4. The polyimide film according to claim 3, wherein the diamine monomer has a molar ratio of (ODA+MDA):PPD ranging from 70:30 to 82:18.

5. The polyimide film according to claim 1, wherein the fillers are sublimated during carbonization and/or graphitization for producing the graphite sheet, forming voids in the graphite sheet.

6. The polyimide film according to claim 1, wherein the fillers have a content ratio of the first filler to the second filler ranging from 10:90 to 17:83.

7. The polyimide film according to claim 1, the content of the fillers is 3000 ppm to 5000 ppm based on the weight of the polyamic acid.

8. The polyimide film according to claim 1, wherein at least one of the fillers are selected from the group consisting of calcium carbonate, dicalcium phosphate and barium sulfate.

9. The polyimide film according to claim 8, wherein the fillers are dicalcium phosphate and/or barium sulfate.

10. A polyimide film for a roll type graphite sheet produced by imidizing a polyamic acid formed by a reaction of a dianhydride monomer and a diamine monomer,
wherein the polyimide film has a modulus of 2.7 GPa or more; and
at least a first filler having an average particle size of at least 2.0 μm and a second filler having an average particle size of 1.6 μm or less, wherein the content ratio of the first filler to second filler ranges from 10:90 to 17:83.

11. The polyimide film according to claim 10, wherein the diamine monomer comprises an oxydianiline (ODA) monomer and a para-phenylene diamine (PPD) monomer and has a molar ratio of ODA:

PPD ranging from 70:30 to 82:18.

12. The polyimide film according to claim 10, wherein the diamine monomer further comprises a methylenedianiline (MDA) monomer.

13. The polyimide film according to claim 10, wherein the fillers are sublimated during carbonization and/or graphitization for producing the graphite sheet, forming voids in the graphite sheet.

14. The polyimide film according to claim 10, the content of the fillers is 3000 ppm to 5000 ppm based on the weight of the polyamic acid.

15. The polyimide film according to claim 10, wherein at least one of the fillers are selected from the group consisting of calcium carbonate, dicalcium phosphate and barium sulfate.

16. The polyimide film according to claim 15, wherein the fillers are dicalcium phosphate and/or barium sulfate.

* * * * *